(12) United States Patent
Wang

(10) Patent No.: US 7,656,321 B2
(45) Date of Patent: Feb. 2, 2010

(54) SIGNALING SYSTEM

(75) Inventor: Yuanlong Wang, Sunnyvale, CA (US)

(73) Assignee: Rambus Inc., Los ALtos, CA (US)

( * ) Notice: Subject to any disclaimer, the term of this patent is extended or adjusted under 35 U.S.C. 154(b) by 935 days.

(21) Appl. No.: 11/145,264

(22) Filed: Jun. 2, 2005

(65) Prior Publication Data

US 2007/0009018 A1    Jan. 11, 2007

(51) Int. Cl.
  *H03M 5/02* (2006.01)
(52) U.S. Cl. .................... 341/56; 375/286; 375/340; 327/71
(58) Field of Classification Search ............ 341/56–59, 341/102, 103; 375/286–292, 317, 319, 340, 375/349; 327/67–71
See application file for complete search history.

(56) References Cited

U.S. PATENT DOCUMENTS

| | | | |
|---|---|---|---|
| 3,369,299 A | 2/1968 | Thomas | |
| 3,587,088 A | 6/1971 | Franaszek | |
| 3,754,237 A | 8/1973 | De Laage de Meux | |
| 4,408,189 A | 10/1983 | Betts et al. | |
| 4,486,739 A | 12/1984 | Franaszek et al. | |
| 4,495,626 A | 1/1985 | Brunin et al. | |
| 4,665,517 A | 5/1987 | Widmer | |
| 4,667,337 A | 5/1987 | Fletcher | |
| 4,855,742 A | 8/1989 | Verboom | |
| 5,142,167 A | 8/1992 | Temple et al. | |
| 5,740,201 A * | 4/1998 | Hui ............................ | 375/286 |
| 5,903,231 A | 5/1999 | Emelko | |
| 5,999,571 A | 12/1999 | Shin et al. | |
| 6,005,895 A | 12/1999 | Perino et al. | |
| 6,067,326 A | 5/2000 | Jonsson et al. | |
| 6,067,594 A | 5/2000 | Perino et al. | |
| 6,078,627 A | 6/2000 | Crayford | |
| 6,094,461 A | 7/2000 | Heron | |
| 6,137,455 A | 10/2000 | Duo | |
| 6,154,498 A | 11/2000 | Dabral et al. | |
| 6,226,330 B1 | 5/2001 | Mansur | |
| 6,278,740 B1 | 8/2001 | Nordyke | |
| 6,324,602 B1 | 11/2001 | Chen et al. | |
| 6,359,931 B1 | 3/2002 | Perino et al. | |
| 6,480,548 B1 * | 11/2002 | Mansur ...................... | 375/242 |
| 6,556,628 B1 | 4/2003 | Poulton et al. | |

(Continued)

FOREIGN PATENT DOCUMENTS

WO    WO 01/97391 A2    12/2001

(Continued)

OTHER PUBLICATIONS

Carusone, Anthony, et al., "Differential Signaling with a Reduced Number of Signal Paths," IEEE Transactions on Circuits and Systems—II: Analog and Digital Signal Processing, vol. 48, No. 3, Mar. 2001, pp. 294-300.

(Continued)

*Primary Examiner*—Howard Williams
(74) *Attorney, Agent, or Firm*—Mahamedi Paradice Kreisman LLP

(57) ABSTRACT

In a signaling system, a first signal and a plurality of second signals are received via a signaling channel. A first received data value is generated in one of at least two states according to whether the first signal exceeds an average of the second signals.

28 Claims, 5 Drawing Sheets

U.S. PATENT DOCUMENTS

| | | | |
|---|---|---|---|
| 7,167,523 B2* | 1/2007 | Mansur | 375/242 |
| 2002/0130797 A1* | 9/2002 | Calvignac et al. | 341/102 |
| 2003/0095606 A1 | 5/2003 | Horowitz et al. | |
| 2004/0150432 A1 | 8/2004 | Poulton et al. | |

FOREIGN PATENT DOCUMENTS

| | | | |
|---|---|---|---|
| WO | WO 01/097391 A3 | 12/2001 | |

OTHER PUBLICATIONS

Marsland, T.A., et al., "A Network Multi-Processor for Experiments in Parallelism," Mar. 31, 1991, pp. 1-29.

Widmer, A.X., et al., "A DC-Balanced, Partitioned-Block, 8B/10B Transmission Code," IBM J. Res. Develop., vol. 27, No. 5, Sep. 1983, pp. 440-451.

Nakamura et al., "A 500-MHz 4-Mb CMOS Pipeline-Burst Cache SRAM with Point-to-Point Noise Reduction Coding I/O", IEEE Journal of Solid-State Circuits, Nov. 1997, 8 pp., vol. 32, No. 11.

Stan, M.R. & W.P. Burleson, "Bus-Invert Coding for Low Power I/O", IEEE Transactions on Very Large Scale Integration Systems, 1999, vol. XX, No. Y.

Stan, M.R. & W.P. Burleson, "Coding a Terminated Bus for Low Power", Great Lakes Symposium on VSLI, Mar. 1995, pp. 70-73.

\* cited by examiner

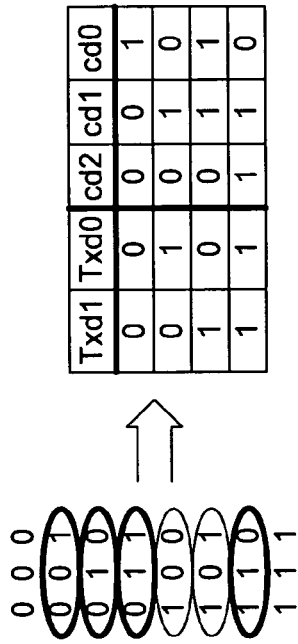
FIG. 2
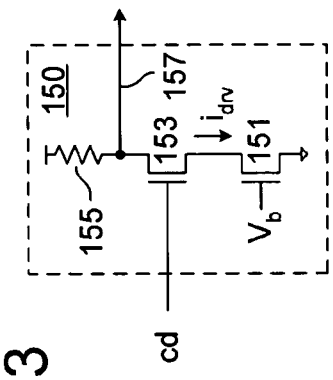
FIG. 3
FIG. 4

FIG. 6

| N (No. Txd bits) | Channel Coding | | |
|---|---|---|---|
| | Number of Wires | No. of B1 Codes | Excess Codes |
| 2 | 3 | 6 (>4) | 2 |
| 4 | 5 | 20 (>16) | 4 |
| 6 | 7 | 70 (>64) | 6 |
| 8 | 9 | 252 (<256) | -- |

FIG. 7

| N (No. Txd bits) | Wire Count | | Wires per transmitted data bit | |
|---|---|---|---|---|
| | Differential | ChannelCoding | Differential | Channel Coding |
| 2 | 4 | 3 | 2 | 1.5 |
| 4 | 8 | 5 | 2 | 1.25 |
| 6 | 12 | 7 | 2 | 1.17 |

FIG. 8

| N (No. Txd bits) | Total I/O Current | | |
|---|---|---|---|
| | Single-Ended | Differential | Channel Coding |
| 2 | $0 - 2i_{drv,single}$ | $2i_{drv,diff}$ | $i_{drv,diff} - 2i_{drv,diff}$ |
| 4 | $0 - 4i_{drv,single}$ | $4i_{drv,diff}$ | $2i_{drv,diff} - 3i_{drv,diff}$ |
| 6 | $0 - 6i_{drv,single}$ | $6i_{drv,diff}$ | $3i_{drv,diff} - 4i_{drv,diff}$ |

FIG. 9

| N (No. Txd bits) | Max dI when Switching | | |
|---|---|---|---|
| | Single-Ended | Differential | Channel Coding |
| 2 | $2i_{drv,single}$ | 0 | $i_{drv,diff}$ |
| 4 | $4i_{drv,single}$ | 0 | $i_{drv,diff}$ |
| 6 | $6i_{drv,single}$ | 0 | $i_{drv,diff}$ |

SIGNALING SYSTEM

FIELD OF THE INVENTION

The present invention relates to high speed signaling within and between integrated circuit devices.

BACKGROUND

Differential signaling is widely used in high-speed signaling systems due to its many advantages over single-ended alternatives. In particular, inherent common mode noise rejection, constant input/output (I/O) current, and implicit reference voltage enable smaller-swing signals to be reliably transmitted and received at substantially faster signaling rates than generally possible in single-ended systems. Unfortunately, differential signaling systems require two wires per signal link and thus have a low wire-efficiency that increases trace routing congestion (often necessitating finer-pitch and therefore higher-capacitance, lower-performance trace layout) and consumes additional I/O pins.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2 illustrates an exemplary encoding operation performed by an encoder circuit within each of the transmit circuits of FIG. 1;

FIG. 3 illustrates a current-mode output driver 150 that may be used to implement each of the output drivers within the transmit circuits of FIG. 1;

FIG. 4 illustrates values of current-mode comparand and reference signals that correspond to the four possible states of coded input signals that correspond to the exemplary encoding arrangement of FIG. 2;

FIG. 6 is a table that illustrates the number of wires, eligible codes and excess codes in channel-coded signaling systems for which code vectors meet a particular balance constraint;

FIG. 7 illustrates the improved wire efficiency of channel-coded signaling systems for which code vectors meet a particular balance code constraint;

FIG. 8 illustrates the I/O current drawn in an exemplary transmitter of a channel-coded signaling system as compared with single-ended and differential systems;

FIG. 9 illustrates a worst-case current differential that may occur in single-ended, differential and channel-coded signaling systems;

DETAILED DESCRIPTION

Figure 1:
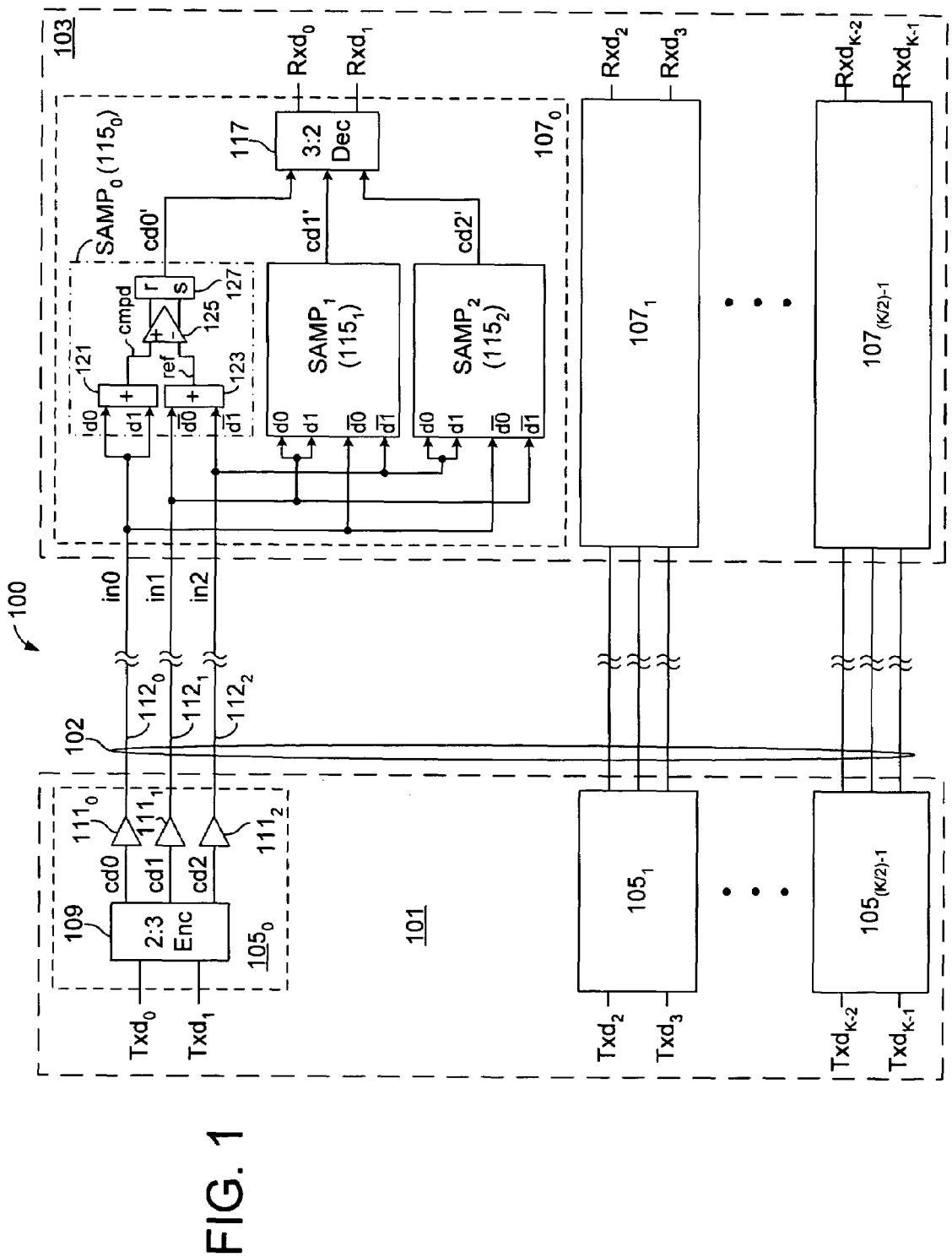
FIG. 1 illustrates channel-coded signaling system according to one embodiment.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. The term "exemplary" is used to express an example, not a preference or requirement.

Systems that employ data coding to enable high-speed signaling with improved wire efficiency are disclosed herein in various embodiments. In a general embodiment, referred to herein as a channel-coded signaling system, a set of transmit data values is encoded into a set of encoded data values before being transmitted on a set of single-ended signaling links. In a binary signaling system, the set of encoded data values includes a substantially balanced number of logic '1' and logic '0' constituents so that, when a signal transmitted on a given signaling link is compared with an average of the signals transmitted on the other signaling links, a detectable signal differential is ensured. That is, because of the balanced 0,1 coding, the average level of signals transmitted on the other signaling links will fall approximately midway between logic '1' and logic '0' signal levels and thus may be used as a decision reference for resolving the data state conveyed in the signal of interest. The data state conveyed in each of the other signals may likewise be resolved by comparison with an average of the remaining signals, so that the set of encoded data values may be recovered and decoded to obtain a set of received data values that corresponds to the original set of transmit data values.

In one embodiment, a set of N transmit data values is encoded into a set of N+1 encoded values so that N+1 wires are used, in effect, to enable transmission of N data values, thus achieving substantially higher wire efficiency than in a 2N-wire differential signaling embodiment. At the same time, many advantages of differential signaling may be maintained.

For example, because the signals averaged to establish the decision reference are transmitted over the same channel as the signal of interest (i.e., the signal to be resolved), noise spikes in the signal of interest generally appear in the decision reference as well, thus limiting common mode noise much as in a differential signaling environment. Also, the decision reference is implicit in the transmitted signals (obviating explicit voltage reference generation), and, because a substantially equal number of '1's and '0's are transmitted in each transmit interval, a relatively constant I/O current is achieved, limiting the switching noise that plagues conventional single-ended signaling systems. Together, the common mode noise rejection, low switching noise and implicit reference voltage enable small-swing signals to be transmitted at or near differential signaling rates over a channel having near single-ended wire efficiency.

FIG. 1 illustrates channel-coded signaling system 100 according to one embodiment. The signaling system 100 includes a pair of integrated circuit devices 101 and 103 coupled to one another via a signaling channel 102. IC 101 includes transmit circuits $105_0$-$105_{(K/2)-1}$ and is referred to herein as the transmit IC, and IC 103 includes receive circuits $107_0$-$107_{(K/2)-1}$ and is referred to as the receive IC. Despite this designation, the transmit IC 101 may have any number of receive circuits 107 (or other types of receive circuits) and the receive IC 103 may have any number transmit circuits 105 (or other types of transmit circuits). Also, a given transmit circuit/receive circuit pair within the transmit IC 101 and/or receive IC 103 may be coupled to the same input/output (I/O) node of the IC, thus forming a signal transceiver.

In general, each of the transmit circuits 105 includes an encoder circuit 109 to encode a set of N transmit data values into a corresponding set of N+M encoded data values, and a set of N+M output drivers 111 to output signals that correspond to the N+M encoded data values onto a set of N+M single-ended signaling links (the N+M signaling links constituting a portion of the (K/2)*(N+M) signaling links that form channel 102). Each of the receive circuits 107 includes N+M sampling circuits 115 to recover the N+M encoded data values from the signals output by a counterpart transmit circuit 105, and a decoder circuit 117 that performs the inverse function of the encoder circuit 109 to generate a set of N receive data values that correspond to the original transmit data values. In the particular embodiment of FIG. 1, each of the transmit circuits $105_0$-$105_{(K/2)-1}$ includes a 2:3 encoder 109 to encode a set of two transmit data bits, $Txd_0$-$Txd_1$, into a corresponding set of three code data bits, cd0-cd2, (i.e., N=2, M=1), and a set of three single-ended output drivers $111_0$-$111_2$ to output corresponding signals onto three signal links $112_0$-$112_2$. Similarly, each of the receive circuits $107_0$-$107_{(K/2)-1}$ includes three sampling circuits $115_0$-$115_2$ each to recover a respective one of the three code data bits from the signals conveyed on signaling links $112_0$-$112_2$ (the recovered code data bits being shown in FIG. 1 as cd0'-cd2'), and a 3:2 decoder circuit 117 that decodes the recovered code data bits to generate a pair of received data values, $Rxd_0$-$Rxd_1$, that correspond to the original pair of transmit data bits.

In one embodiment, the encoder circuit 109 within each of the transmit circuits 105 converts the transmit data bit pair into a three-bit code having a substantially balanced number of logic '1' and logic '0' values, thus enabling the code bit conveyed in a given signal to be recovered by comparing the signal level with an average of the levels of the other two signals. In one implementation, shown for example in FIG. 2, the encoder circuit 109 outputs a set of three code data bits which meet the constraint |n[0]-n[1]|≦1 for each possible state of the transmit data bit pair. That is, of the eight code vectors possible in a three-bit code, the six code vectors (circled in FIG. 2) for which the difference between the number of logic '0' values (n[0]) and the number of logic '1' values (n[1]) is less than or equal to one, referred to herein as balance-plus-one (B1) codes, are eligible to be used as a system code vector; a set of encoded values that is output from the encoder 109 in response to a given transmit data bit pattern. In the particular embodiment of FIG. 2, the four bold-circled B1 codes (001, 010, 011 and 110) constitute the system code vectors output from the 3:2 encoder 109 of FIG. 1 in response to each of the four possible transmit data bit patterns. In general, the subset of eligible code vectors selected to be the system code vectors may include any combination of the eligible code vectors and may be selected based on a number of criteria including, for example and without limitation, the amount of logic required to implement the encoder circuit 109 and decoder circuit 117, power consumption (e.g., if more power is consumed transmitting a logic '1' value than a logic '0' value, the system code vectors may be chosen to minimize the number of logic '1' values), and/or signaling margin.

FIG. 3 illustrates a current-mode output driver 150 that may be used to implement each of the output drivers 111 within transmit circuits 105 of FIG. 1. The output driver 150 includes a biasing transistor 151, data-switched transistor 153 and pull-up element 155 coupled in series between a ground node and a supply voltage node. The biasing transistor 151 receives a bias voltage ($V_b$) at its gate terminal and thus forms a current source that controls the amount of drive current ($i_{drv}$) drawn from the pull-up element when the data-switched transistor 153 is switched on (i.e., to a conducting state). That is, when a logic high (e.g., logic '1') coded data bit (cd) is received at the gate of the data-switched transistor 153, the data-switched transistor 153 is switched on to enable current $i_{drv}$ to flow through pull-up element 155 (shown as a resistor in FIG. 3, though other types of pull-up elements may be used), thereby causing the voltage at output node 157 to drop to approximately $V_S$-$i_{drv}R$, where $V_S$ is the supply voltage, and R is the resistance of the pull-up element 155. Output node 157 forms the output of the output driver 150 and, referring to FIG. 1, may be coupled to a signal line 112 (e.g., single-ended signaling link) via an external interface (e.g., pad or other interconnection structure) of the transmit IC 101. By this arrangement, the voltage on signal line 112 is discharged (i.e., pulled down) in response to a logic '1' code data bit and charged (pulled up) in response to a logic '0' code data bit. In alternative embodiments, the correspondence between code data state and signal line voltage may be reversed. Also, other types of output driver circuits may be used in alternative embodiments. Further, while the pull-up element 155 is depicted in FIG. 3 as being part of the output driver 150, the pull-up element 155 may be disposed elsewhere in the transmit IC 101 or may be externally coupled to the signal line 112 (e.g., in a single-ended or double-ended termination arrangement). Also, the pull-up element 155 may have an impedance chosen to produce a total desired impedance when coupled to a specified-impedance signal line.

In one embodiment, each of the sampling circuits $115_0$-$115_2$ within a given receive circuit 107 of FIG. 1 includes signal summing circuit 121, reference summing circuit 123, comparator 125 and latch 127. The signal summing circuit 121 has a pair of operand inputs (d0,d1) that constitute signal inputs of the sampling circuit 115, and the reference summing circuit 123 has a pair of operand inputs (/d0, /d1) that constitute reference inputs of the sampling circuit 115. As shown, the signal inputs of sampling circuit $115_0$ are coupled in common to receive input signal in0 (the signal on line $112_0$ that conveys code data value cd0), and the reference inputs of sampling circuit $115_0$ are coupled to receive input signals in1 and in2 (the signals on lines $112_1$ and $112_2$ that convey code data values cd1 and cd2, respectively). In one embodiment, the signal summing circuit 121 and reference summing circuit 123 generate signals that correspond to averages of the signals provided at their respective inputs. In sampling circuit $115_0$, for example, signal summing circuit 121 generates a signal, referred to herein as a comparand signal, that corresponds to input signal in0 averaged with itself (and therefore corresponds to input signal in0), while the reference summing circuit generates a signal, referred to herein as a reference signal, that corresponds to an average of input signals in1 and in2. In one embodiment, described below in further detail, the comparand signal and reference signal are current mode signals that have an amplitude (i.e., level of current flow) that are compared within comparator 125 (e.g., implemented by a sense amplifier) to generate a differential comparison result that either sets or clears latch element 127, thus producing recovered code data value, cd0'. In another embodiment, also described below, a preamplifier is used to generate voltage mode comparand and reference signals that are compared within comparator 125 to produce a differential comparison result for setting or clearing latch element 127.

FIG. 4 illustrates values of current-mode comparand and reference signals that correspond to the four possible states of the input signals, in0, in1 and in2, assuming the exemplary encoding arrangement of FIG. 2. More specifically, when input signal in0 conveys a logic '0' code data bit (e.g., charged signal line and therefore high input to sampling circuit $115_0$ of FIG. 1) then, due to the balanced coding of logic '1' and logic '0' states in the cd0-cd2 values, input signals in1 and in2 will convey either '10' code data states or a '11' code data states. Assuming that each summing circuit 121, 123 within sampling circuit $115_0$ draws an incremental pull-down current $I_{PD}$ for each high signal received (i.e., each logic '0' data bit conveyed), then signal summing circuit 121 will generate a comparand signal having amplitude $2I_{PD}$ ($I_{PD}+I_{PD}$ for the high in0 signal received at each of its two inputs), while reference summing circuit 123 will generate a reference signal having amplitude $I_{PD}$ (in1, in2='10') or $0I_{PD}$ (in2,in2 = '11'). Similarly, if in0 is low (i.e., conveys logic '1' code data) then, due to the balanced coding, input signals in1 and in2 will either be high to convey '00' code data states or will be split between high and low to convey '10' code data states. In that case, signal summing circuit 121 will generate a comparand signal having amplitude $0I_{PD}$ and reference summing circuit 123 will generate a reference signal having amplitude $2I_{PD}$ or $I_{PD}$. Thus, for each of the four possible states of the input signals in0-in2, a comparand signal that corresponds to the in0 signal will differ from a reference signal that corresponds to an average of the remaining signals, in1 and in2, by at least $I_{PD}$, thereby enabling data recovery by comparison of the comparand and reference signals in comparator 125, with the final recovered code data value, cd0', latched in latch element 127. Code data values cd1' and cd2' are similarly recovered in sampling circuits $115_1$ and $115_2$, respectively, which receive the in1 and in2 signals at their respective signal inputs and remaining signals (in0,in2 and in0,in1) at their respective reference inputs. That is, in sampling circuit $115_1$, the balanced signal coding ensures that a comparand signal that corresponds to input signal in1 will differ from a reference signal that corresponds to an average of the in0 and in2 signals by at least $I_{PD}$ and, in sampling circuit $115_2$, a comparand signal that corresponds to input signal in2 will differ from a reference signal that corresponds to an average of the in0 and in1 signals by at least $I_{PD}$. Thus, despite the fact that each code data value is signaled via a single-ended signaling link, the code data value is recovered by a comparison of the corresponding signal with a reference implicitly conveyed in other signal links. By this operation, explicit reference voltage generation is obviated and, because noise appearing on all three wires of a given three-wire set will yield substantially matching increases in the comparand and reference signals generated within each sampling circuit 115, common mode noise is rejected in a manner analogous to that of a differential signaling system. Also, because a substantially balanced number of '1's and '0's is conveyed in each transmit interval, a relatively constant I/O current is achieved, reducing switching noise relative to conventional single-ended signaling systems. In a number of embodiments, the common mode noise rejection and reduced switching noise provide substantially improved signaling margin relative to conventional single-ended signaling systems and therefore enable signal swing (i.e., the voltage differential between the signal levels used to convey logic '0' and logic '1' data states in a binary signaling system) to be reduced and signal transition rate to be increased without significant increase in bit error rate. At the same time, wire count is reduced (and wire efficiency therefore improved) relative to a differential signaling system by a factor of (N+1)/2N, where N is the number of transmit data values transmitted over a channel-coded set of signaling links. That is, 2N wires are required to transmit N data values in a differential signaling system, while only N+1 wires are required to transmit the same number of data values in a channel-coded signaling system.

It should be noted that while the comparand and reference currents generated by summing circuits 121 and 123 of FIG. 1 have been described in terms of incremental pull-down currents ($I_{PD}$), the actual current drawn by either summing circuit may include a baseline current so that, for example, the current $0I_{PD}$ current is a non-zero current, and currents $I_{PD}$, $2I_{PD}$, etc. are likewise offset relative to the baseline current. Also, as discussed below, the comparand and reference signals may be transient signals that are used to set up an initial condition for a sense (or compare) operation within comparator 125. That is, the differential current between the comparand and reference signals may be valid only at the beginning of a sampling operation, for example, during the transition period of a sense-enable transistor or other component.

Figure 5:
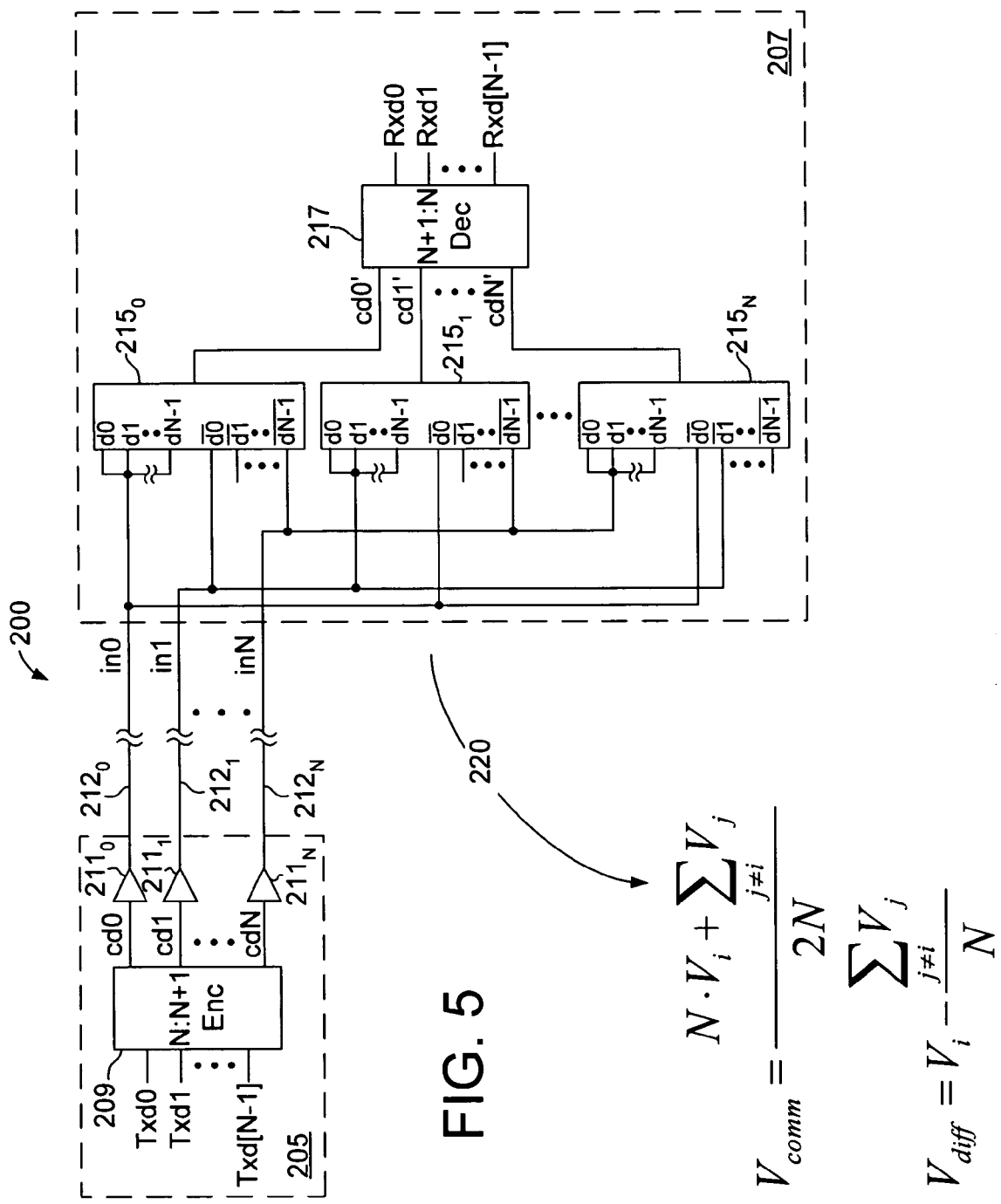
FIG. 5 illustrates a generalized embodiment of a channel-coded signaling system that transmits N transmit data values over a set of N+1 single-ended signaling links.

FIG. 5 illustrates a generalized embodiment of a channel-coded signaling system 200 that transmits N transmit data values (Txd[N-1:0]) over a set of N+1 single-ended signaling links $212_0$-$212_N$. As shown, a transmit circuit 205 includes an N:N+1 encoder 209 and N+1 output drivers $211_0$-$211_N$ to drive signals that correspond to N+1 code data values (cd0-cdN) over signaling links $212_0$-$212_N$. A counterpart receive circuit 207 includes N+1 sampling circuits $215_0$-$215_N$ each having a set of N signal inputs (d0-dN-1) coupled to receive a signal of interest, and a set of N reference inputs (/d0-/dN-1) coupled to receive the remaining signals. That is sampling circuit $215_0$ is coupled to receive signal in0 at each of its signal inputs, and signals in1-inN at its reference inputs; sampling circuit $215_1$ is coupled to receive signal in1 at each of its signal inputs, and signals in0 and in2-inN at its reference inputs; and so forth to sampling circuit $215_N$ which is coupled to receive signal inN at each of its signal inputs and signals in0-inN-1 at its reference inputs. In one embodiment, each of the sampling circuits $215_0$-$215_N$ is implemented generally as described in reference to sampling circuit $115_0$ of FIG. 1, except that the signal summing circuit 121 sums N instances of the signal of interest to generate the reference signal, and the reference summing circuit 123 sums the N remaining signals (which, due to balanced encoding by encoder 209, will include a substantially balanced number of high and low signal states) to produce a reference signal. The N+1 recovered code data bits, cd0'-cdN', generated by sampling circuits $215_0$-$215_N$ are supplied to decoder circuit 217. The decoder circuit 217, in turn, performs a N+1:N decoding operation to generate a set of N received data values, Rxd[N-1:0], that correspond to the original set of transmitted data values.

Assuming that the signal of interest is in[i] (where i is an index selected from the set 0-N), then the common mode voltage, $V_{COMM}$, and differential voltage, $V_{DIFF}$, perceived by a given sampling circuit 215 may be expressed as shown at 220. That is, the common mode voltage (generally, the average of voltages supplied to a differential sampler) may be expressed as N times $V_i$ (the voltage level of the signal of interest) plus the sum of voltages conveyed in the remaining signals $V_j$ (where j is an input signal index that ranges from 0 to N, excluding i) divided by 2N. Note that the division by N yields, in effect, Vi at the signal input (i.e., Vi averaged with itself as in N*$V_i$/N=$V_i$, where '*' denotes multiplication) and an average of the reference signals at the reference input. The summation of the averaged input and reference signals and division by two completes the common mode expression. The differential voltage may be understood as a difference between the averages of the signal levels at the signal inputs and reference inputs of a given sampling circuit. That is, the average signal level appearing at the signal inputs is N*Vi/Vi=Vi, and the average signal level appearing at the reference inputs is ($\Sigma V_j$)/N where j ranges from 0 to N, excluding i. Reflecting on the common mode and differential voltage expressions shown in FIG. 5, it can be seen that a noise spike that appears equally on all N+1 signaling links of the signaling channel will cause the common mode voltage to rise, but will not affect the differential voltage.

It should be noted that the term average herein is used to mean a sum of signals scaled by any scaling factor. That is, a sum of N signals may be divided by a scaling factor other than N (including unity in which case no scaling is applied), and still be deemed an average of the N signals for present purposes. Also, as discussed below, scaling may be achieved by circuit characteristics (e.g., transistor width selection) rather than by explicit division or multiplication.

FIG. 6 is a table that illustrates the number of wires, eligible codes and excess codes in channel-coded signaling systems that meet the B1 code constraint (i.e., |n[0]-n[1]|≦1), for progressively increased numbers of transmit data bits. Thus, when the number of transmit data bits (N) is two, three wires are used to implement the coded channel, the number of B1 codes (i.e., eligible codes) is six, and, because only four B1 codes are needed (i.e., the data space includes $2^N=2^2=4$ bit patterns), there are two excess codes. In general, assuming that N is an even number, the number of B1 codes in a $2^{N+1}$ code space is given by 2*(2K+1)!/K!(K+1)!, where K=N/2. Thus, when the number of transmit data bits is increased to four, five wires are used to implement the coded channel (or segment thereof) and the number of B1 codes increases to twenty, leaving an excess of four (20-$2^4$) codes. When the number of transmit data bits is increased to six, seven wires are used to implement the coded channel and the number of B1 codes increases to 70, leaving an excess of six (70-$2^6$) codes. In all such cases, the excess codes may be used to convey out-of-band data or used for any other purpose.

Still referring to FIG. 6, when the number of transmit data bits is increased to eight, nine wires are used to implement the channel and the number of B1 codes increases to 252, four short of the 256 codes needed to represent the entire $2^N$ data space. If the entire $2^N$ data space needs to be represented, the B1 code constraint may be relaxed to overcome the B1 code shortage that occurs when N is eight or higher. For example, in one embodiment, an additional wire may be provided to form a 10-wire channel and four B2 codes (balance-plus-two codes that meet the constraint |n[0]-n[1]|≦2) may be selected to complete the code vector set. Although B2 codes generally allow for greater imbalance and therefore reduced differential voltage between a signal of interest and an average of remaining signals, the increased number of averaged signals mitigates the increased imbalance (e.g., nine signals may be averaged to produce the reference signal in an N=8, B2 coded embodiment). Alternatively, B3 codes (i.e., balance-plus-three codes that meet the constraint |n[0]-n[1]|≦3) may be used to increase the number of eligible codes without having to increase the number of wires in the channel. In general, any difference, K, between the number of '1' and '0' values in a given code (i.e., |n[0]-n[1]|≦K) may be used so long as a detectable voltage differential (or current differential) is ensured when the signal of interest is compared with an average of the remaining signals or an average of a subset of the remaining signals. Also, while N is generally described herein in terms of even numbers (i.e., even numbers of transmit data bits), N may be an odd number in alternative embodiments.

FIG. 7 illustrates the improved wire efficiency of channel-coded signaling systems that meet the B1 code constraint for different values of N (i.e., different numbers of transmit data bits). As discussed above, when N=2, three wires are used in the channel-coded signaling system as compared with four wires in a differential system, thus yielding an improved wire efficiency of 1.5 wires per transmitted data bit versus two wires per transmitted data bit in the differential system. When N is increased to four, wire efficiency is further improved as only 5 wires are used in the channel-coded signaling system yielding 1.25 wires per transmitted data bit versus two wires per transmitted data bit in the differential system. Wire efficiency is further improved when N is increased to 6, as the 7 wires used in the channel-coded signaling system correspond to 1.17 wires per transmitted data bit versus two wires per transmitted data bit in the differential system.

FIG. 8 illustrates the I/O current drawn in an exemplary transmitter of a channel-coded signaling system as compared with single-ended and differential systems. That is, when N=2, a single-ended system draws a current of 0 to $2i_{drv,single}$ depending on the states of the transmitted bit pair so that, assuming a random distribution of transmitted data states, the single-ended transmitter will, on average, consume power in proportion to $i_{drv,single}$ (i.e., averaging the zero and $2i_{drv,single}$ values). By contrast, a differential signaling system draws a substantially constant $2i_{drv,diff}$ regardless of the states of the transmitted bit pair and consumes power accordingly. Due to the larger signal swing typically required in single-ended signaling systems, $i_{drv,single}$ is generally larger than $i_{drv,diff}$ so that power consumed in the differential system may not be substantially more than in a corresponding single-ended system. In the channel coded signaling system for which N=2 (i.e., two transmitted data bits), small-swing signals are transmitted on either one or two single-ended signal lines in each transmit interval, so that the transmit circuit draws a current of $i_{drv,diff}$ to $2i_{drv,diff}$ and therefore (assuming a random transmit data distribution) consumes power in proportion to $1.5i_{drv,diff}$; less than in a differential system. As N is increased to four, the single-ended and differential transmit currents increase to 0-$4i_{drv,single}$ and $4i_{drv,diff}$, respectively, while, in the channel-coded system, current increases to 2-$3i_{drv,diff}$. Similarly, when N is increased to six, the single-ended and differential transmit currents increase to 0-$6i_{drv,single}$ and $6i_{drv,diff}$ respectively, while, in the channel-coded system, current increases to $3\text{-}4i_{drv,diff}$. Thus, as wire efficiency improves in the channel-coded signaling system with increased value of N, power savings is also increased relative to the differential system.

FIG. 9 illustrates a worst-case current differential (dI) that may occur in single-ended, differential and channel-coded signaling systems from one transmit interval to the next (i.e., due to change in state of transmit data bits). In a single ended-signaling system, the worst-case dI occurs when all N data bits change state, yielding a dI of $N^*i_{drv,single}$ (N=2, 4, 6). By contrast, because one line or the other of each differential signaling link is always driven, dI is zero or near zero in a differential signaling system. In a channel coding system that meets the B1 constraint, the worst case dI occurs in a transition from a code having an excess '0' (i.e., one more '0' than '1') to a code having an excess '1', thus yielding a worst case dI of $i_{drv,diff}$ for each of the shown values of N. Thus, the channel coded signaling system achieves a substantially reduced current differential, and therefore reduced switching noise, as compared with a conventional single-ended system.

Figure 10:
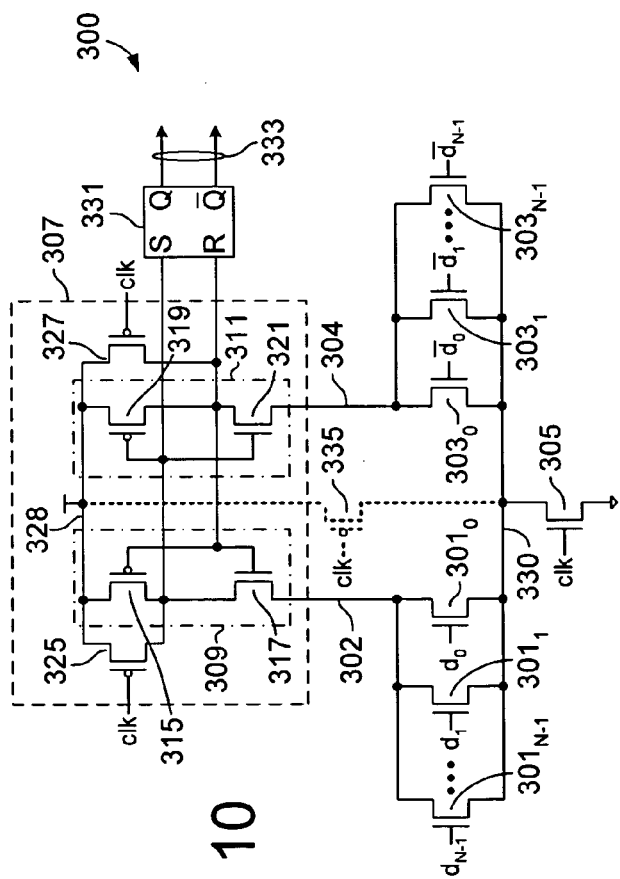
FIG. 10 illustrates an embodiment of a multi-input sampling circuit that may be used to implement the sampling circuits described in reference to FIGS. 1 and 5.

FIG. 10 illustrates an embodiment of a multi-input sampling circuit 300 that may be used to implement the sampling circuits 115 and 215 described in reference to FIGS. 1 and 5, respectively. The sampling circuit 300 includes a set of N input transistors $301_0$-$301_{N-1}$, a set of N reference transistors $303_0$-$303_{N-1}$, a sense-enable transistor 305, a sense amplifier 307 and a latch element 331. Each of the input transistors $301_0$-$301_{N-1}$ is coupled between a comparand input 302 of sense amplifier 307 and the drain terminal of sense-enable transistor 305, and each of the reference transistors $303_0$-$303_{N-1}$ is similarly coupled between a reference input 304 of sense amplifier 307 and the drain terminal of sense-enable transistor 305. In the embodiment shown, the source terminal of the sense-enable transistor 305 is coupled to ground and the gate terminal of the sense-enable transistor 305 is coupled to receive a sampling clock signal (clk).

The sense amplifier 307 includes a pair of input-to-output-coupled inverters 309, 311 formed, respectively, by transistors pairs 315/317 and 319/321, with the output of inverter 309 coupled to the set input of latch element 331 and the output of inverter 311 coupled to the reset input of latch element 331. The sense amplifier further includes a pair of precharge transistors 325, 327 coupled between a supply voltage node 328 and the output nodes of inverters 309 and 311, respectively, and having gate terminals coupled to receive the sampling clock signal. In the embodiment of FIG. 10, the precharge transistors 325, 327 are P-type MOS transistors and the sense-enable transistor 305 is an N-type MOS transistor so that, when the sampling clock signal is low (a precharge phase of the sampling clock signal), the sense-enable transistor 305 is switched off (i.e., to a substantially non-conducting state) and the precharge transistors 325, 327 are switched on to enable a precharge operation. In the precharge operation, the output nodes of both inverters 309 and 311 are pulled high through the precharge transistors 325, 327 and, because of the input-to-output inverter coupling, transistors 317 and 321 are switched on to precharge the comparand input 302 and reference input 304 of the sense amplifier (i.e., the comparand input 302 is pulled high via transistors 317 and 325, and the reference input 304 is pulled high via transistors 321 and 327). Because the sense-enable transistor 305 is switched off during the precharge operation, little or no current flows through the input transistors and reference transistors so that the comparand and reference inputs 302, 304 are charged to substantially equal voltages.

When the sampling clock signal goes high, sense-enable transistor 305 is switched to a conducting state, thereby enabling the input transistors 301 and reference transistors 303 to develop current-mode comparand and reference signals on the comparand and reference inputs 302, 304 of the sense amplifier 307 (i.e., draw current to discharge the pre-charged state of the comparand and reference inputs 302, 304). In one embodiment, the input transistors 301 are coupled in common to an input signal line and thus are switched to either a high-conductance state or a low-conductance state according to the state of a signal of interest. That is, if the signal of interest is high, the input transistors 301 each draw a current $I_{PD}$ so that a total current $N^*I_{PD}$ (N being the number of received data values ultimately to be recovered from the N+1 coded channel) is drawn from comparand input 302, and if the signal of interest is low, the input transistors are switched to a substantially non-conducting state (or at least a lower-current conducting state depending on the low level of the input signal) so that a nominally zero current $0I_{PD}$ is drawn from comparand input 302. The reference signal transistors 303, by contrast, are coupled to respective signal lines that carry the remaining signals of the coded channel (or portion thereof) and therefore receive a substantially equal number of high and low signals (i.e., $|n[0]\text{-}n[1]|\leq 2$ for the remaining signals in a B1 coded channel) and so generate a current that corresponds to a sum of the of the levels of the remaining signals. Note that the actual currents drawn by input transistors 301 and reference transistors 303 may include a baseline current so that, for example, the current $0I_{PD}$ current is a non-zero current, and currents $I_{PD}$, $2I_{PD}$, etc. are likewise offset relative to the baseline current. Also, rather than being static signals, the comparand and reference signals on inputs 302 and 304 are used to set up an initial condition for a sense (or compare) operation within sense amplifier 307. That is, the differential current between the comparand and reference signals may be valid only at the beginning of the sampling operation, for example, during the transition period of transistor 305.

In one embodiment, the input transistors 301 and reference transistors 303 each have a width W/N, where W is the width of a transistor that would produce a desired pull-down current $N^*I_{PD}$ in response to a high input signal. By this arrangement, the N reference transistors 303 draw a total current (i.e., a reference signal) that is proportional to an average of the levels of the signals received at their respective gate terminals. That is, the reference signal is proportional to $\Sigma V_j/N$, where j ranges from 0 to N, excluding i, the index of the signal of interest. Similarly, the N input transistors 301 draw a total current (i.e., a comparand signal) that is proportional to an average of the levels of the signals received at their respective gate terminals which, due to common coupling to the same signal line, results in a comparand signal that is proportional to the level of the signal of interest averaged with itself. That is, the comparand signal is proportional to $NV_i/N$, or $V_i$. By this arrangement, and because of the balanced coding scheme, the comparand signal is ensured to be higher or lower than the reference signal according to whether the data state conveyed in the signal of interest is a '0' or '1', respectively (e.g., as shown in the table of FIG. 4), thereby discharging either the comparand input 302 or the reference input 304 to enable a sense operation (i.e., a compare operation) within sense amplifier 307. For example, if a logic '0' data state is conveyed in the signal of interest, then the comparand signal will have an amplitude of $N^*I_{PD}$ and the reference signal will have an amplitude of $(N/2)^*I_{PD}$ or $(N/2\text{-}1)^*I_{PD}$, thereby causing comparand input 302 to be discharged to a greater extent than reference input 304. Because transistors 317 and 321 are initially in a conducting state when the sense-enable transistor 305 is switched on, discharging the comparand input 302 pulls the output of inverter 309 low; a tendency that is reinforced by the back-to-back coupling of inverters 309, 311 as the low-going output of inverter 309 causes the input of inverter 311 to go low, thereby latching a logic high state at the output of inverter 311 (i.e., transistor 321 off and transistor 319 on) and a logic low state at the output of inverter 309 (i.e., transistor 317 on and transistor 315 off). The high output of inverter 311 resets the latch element 331 to generate a logic-low code data bit at 333. Because the sense amplifier 307 functions, in effect, as a comparator-latch that is coupled back-to-back with latch element 331, an edge-triggered sampling operation is effected within the sampling circuit 300. Accordingly, the sampling circuit 300 may be viewed as a multi-input sense amplifier flip-flop.

Still referring to FIG. 10, in high-speed signaling systems, it may be desirable to pull-up the drain terminal of the sense-enable transistor 305 during the precharge phase to discharge node 330 to a known state. In one embodiment, an equalizing transistor 335 is coupled between the voltage supply node 328 and drain of the sense-enable transistor 305 and switched on during the precharge phase for this purpose.

While the sampling circuit of FIG. 10 may work as intended in many applications, the gate-to-source capacitance of the input transistors 301 and reference transistors 303 may cause unacceptable loss of receiver sensitivity in some high-speed signaling systems. More specifically, when the sense-enable transistor 305 initially begins to discharge node 330 (i.e., as the sampling clock signal transitions from low to high), current may leak through the gate-to-source capacitance ($C_{GS}$) of the input transistors 301 and reference transistors 303 that receive high signals, undesirably perturbing the voltage level of those signals and thus reducing the total differential between the comparand and reference signals generated on inputs 302 and 304. Such loss of sensitivity may be exacerbated by skew between the clock signal transition at different sampling circuits coupled to the same set of signal lines as the leakage phenomenon in one or more sampling circuits may occur just prior to assertion of the sampling clock signal in another sampling circuit. That is, the sampling operation within one of the sampling circuits may be triggered after $C_{GS}$ leakage in the other sampling circuits has already reduced the high voltage levels on the input signal lines. Mismatch between transistor widths may also lead to different levels of leakage within the various sampling circuits, potentially further reducing signaling margin.

Figure 11:
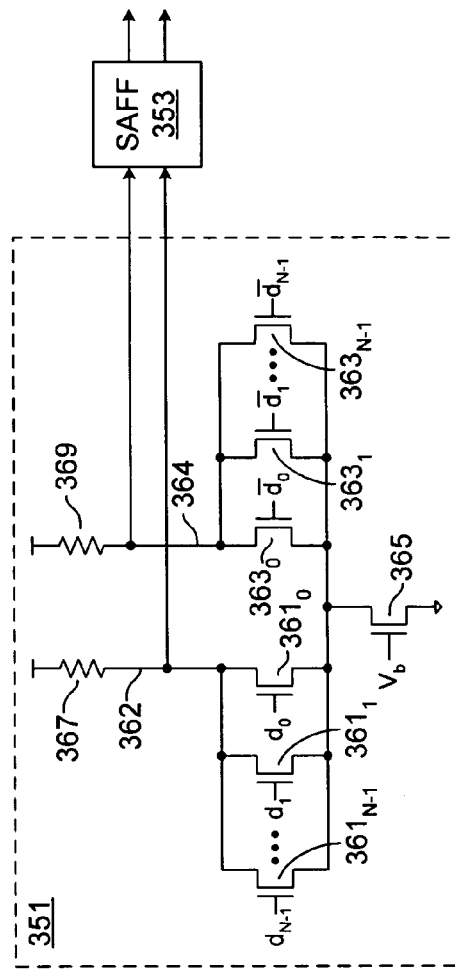
FIG. 11 illustrates an embodiment of a sampling circuit that includes a preamplifier stage.

FIG. 11 illustrates an embodiment of a sampling circuit 350 that includes a preamplifier stage 351 to mitigate the $C_{GS}$ leakage problem described above. The preamplifier stage 351 includes a set of input transistors $361_0$-$361_{N-1}$ coupled between preamplifier output node 362 and the drain terminal of a biasing transistor 365, and a set of reference transistors $363_0$-$363_{N-1}$ coupled between preamplifier output node 364 and the drain terminal of biasing transistor 365. The biasing transistor 365 is operated as a constant current source (i.e., drawing a current according to a gate bias voltage, $V_b$) so that abrupt voltage changes at the source terminals of the input transistors 361 and reference transistors 363 are largely avoided, thereby substantially reducing $C_{GS}$ leakage. The preamplifier output nodes 362 and 364 are pulled up through resistive elements 367 and 369 (which may be implemented by resistors, active loads, or any other resistive elements) so that a differential voltage is developed on the preamplifier output nodes 362, 364 in accordance with the signals supplied to the gates of the input transistors 361 and reference transistors 363. More specifically, considering the voltage at node 362 to be a comparand signal and the voltage at node 364 to be a reference signal, the comparand voltage level (i.e., voltage at node 362) is inversely proportional to the signal of interest, $V_i$, and the reference voltage level is inversely proportional to an average of the remaining signals, $\Sigma V_j/N$ (i.e., assuming that the signal of interest is supplied to the gate terminals of the input transistors 361 and that the remaining signals are supplied to the gate terminals of the reference transistors 364). In one embodiment, the differential voltage generated on the preamplifier output nodes 362, 364 is supplied to a differential-input sense amplifier flip-flop 353 that operates in generally the same manner as the sampling circuit of FIG. 10, except that the input transistors 301 are replaced by a single transistor having a gate terminal coupled to preamplifier output node 364 and the reference transistors 303 are replaced by a single transistor having a gate terminal coupled to preamplifier output node 362. Other circuits may be used to sample the state of the preamplifier output nodes in alternative embodiments.

It should also be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

While the invention has been described with reference to specific embodiments thereof, it will be evident that various modifications and changes may be made thereto without departing from the broader spirit and scope of the invention. Accordingly, the specification and drawings are to be regarded in an illustrative rather than a restrictive sense.

What is claimed is:

1. A method of operation within a signaling system, the method comprising:

receiving a first signal and a plurality of second signals via a signaling channel; and generating a first received data value in one of at least two states according to whether the first signal exceeds an average of the second signals; and generating a second received data value in one of the at least two states according to whether a first one of the second signals exceeds an average of at least the first signal and a second one of the second signals.

2. The method of claim 1 wherein generating a first received data value in one of at least two states according to whether the first signal exceeds an average of the second signals comprises:

generating a comparand signal having an amplitude according to a first data value conveyed in the first signal;

generating a reference signal having an amplitude according to a sum of second data values conveyed respectively in the second signals; and generating the first received data value in one of the at least two states according to whether the amplitude of the comparand signal exceeds the amplitude of the reference signal.

3. The method of claim 2 wherein generating a comparand signal that has an amplitude according to a first data value conveyed in the first signal comprises generating a current that has an amplitude according to a signal level of the first signal.

4. The method of claim 2 wherein generating a reference signal having an amplitude according to a sum of second data values comprises generating a current that has an amplitude according to the sum of the second data values.

5. The method of claim 2 wherein generating the first received data value in one of the at least two states according to whether the amplitude of the comparand signal exceeds the amplitude of the reference signal comprises:

generating a differential voltage within an amplitude-sensing circuit according to a difference between the amplitude of the comparand signal and the amplitude of the reference signal; and setting a latch circuit to a first state of the at least two states if the differential voltage has a first polarity and setting the latch circuit to a second state of the at least two states if the differential voltage has a second polarity.

6. The method of claim 1 further comprising:

generating a third received data value in one of the at least two states according to whether the second one of the second signals exceeds an average of at least the first signal and the first one of the second signals.

7. The method of claim 1 further comprising:

encoding a set of transmit data values to generate a larger set of encoded data values; and outputting the first signal and the plurality of second signals onto the signaling channel in accordance with respective data values included within the set of encoded values.

8. The method of claim 7 wherein outputting the first signal and the plurality of second signals onto the signaling channel in accordance with respective data values included within the set of encoded values comprises:

developing either a first voltage or a second voltage on the signaling channel according to whether the respective data value is in the first state or the second state; and developing either a first voltage or a second voltage on the signaling channel comprises drawing current from the signaling channel at either a first level or a second level.

9. The method of claim 7 wherein encoding a set of transmit data values into a larger set of encoded data values comprises encoding a set of N bits into a set of N+M bits that, for each of the $2^{N+M}$ possible bit combinations of the set of N+M bits, has a substantially balanced number of logic '0' bits and logic '1' bits.

10. The method of claim 7 wherein encoding a set of transmit data values into a larger set of encoded data values comprises encoding a set of N bits into a set of N+1 bits that, for each of the $2^{N+1}$ possible bit combinations of the set of N+1 bits, has a difference less than two between the number of logic '1' bits and the number of logic '0' bits.

11. The method of claim 7 wherein encoding a set of transmit data values into a larger set of encoded data values comprises encoding a set of N bits into a set of N+M bits that, for each of the $2^{N+M}$ possible bit combinations of the set of N+M bits, has a difference between the number of logic '0' bits and logic '1' bits that is not more than 25% of the value, N+M.

12. A method of operation within a signaling system, the method comprising:

receiving at least a first, a second, and a third signals, via a signaling channel;

generating a first received data value in one of at least two states according to whether the first signal exceeds an average of at least the second and the third signals;

generating a second received data value in one of at least two states according to whether the second signal exceeds an average of at least the first and the third signals;

generating a third received data value in one of the at least two states according to whether the third signal exceeds an average of at least the first and the second signals; and decoding a set of received data values, including at least the first, second and third received data values, to generate a smaller set of decoded data values.

13. The method of claim 12 wherein the set of decoded data values comprises one less data value than the set of received data values.

14. An integrated circuit device comprising:

an interface to receive a first signal and a plurality of second signals;

a first sampling circuit coupled to receive the first signal and the plurality of second signals from the interface and configured to generate a first received data value in one of at least two states according to whether the first signal exceeds an average of the second signals, and a second sampling circuit coupled to receive the first signal and the plurality of second signals from the interface and configured to generate a second received data value in one of the at least two states according to whether a first one of the second signals exceeds an average of at least the first signal and a second one of the second signals.

15. The integrated circuit device of claim 14 further comprising:

a third sampling circuit coupled to receive the first signal and the plurality of second signals from the interface and configured to generate a third received data value in one of the at least two states according to whether the second one of the second signals exceeds an average of at least the first signal and the first one of the second signals.

16. The integrated circuit device of claim 14 wherein the interface comprises a plurality of input nodes to the first signal and the plurality of second signals from a signaling channel external to the integrated circuit device.

17. The integrated circuit device of claim 14 wherein the first sampling circuit comprises:
a first plurality of input transistors having first terminals coupled in common to receive the first signal;
a second plurality of input transistors having first terminals coupled to receive respective signals of the plurality of second signals;
sensing circuitry having a comparand node coupled to second terminals of the first plurality of input transistors and a reference node coupled to second terminals of the second plurality of input transistors; and
current-sinking circuitry coupled to third terminals of each of the first plurality of transistors and to third terminals of each of the second plurality of input transistors to enable current to flow through each transistor of the first plurality of transistors in accordance with a level of the first signal and to enable current to flow through each transistor of the second plurality of transistors in accordance with respective levels of the plurality of second signals.

18. The integrated circuit device of claim 17 wherein the sensing circuitry is configured to sense a difference between a signal level at the comparand node and a signal level at the reference node, and to generate a compare signal having a first state or a second state according to whether the signal level at the comparand node is greater than or less than the signal level at the reference node.

19. An integrated circuit device comprising:
an interface to receive at least a first, a second, and a third signals;
a first sampling circuit coupled to receive at least the first, the second, and the third signals from the interface and configured to generate a first received data value in one of at least two states according to whether the first signal exceeds an average of least the second and the third signals;
a second sampling circuit coupled to receive at least the first, the second, and the third signals from the interface and configured to generate a second received data value in one of at least two states according to whether the second signal exceeds an average of at least the first and third signals;
a third sampling circuit coupled to receive at least the first, the second, and the third signals from the interface and configured to generate a third received data value in one of the at least two states according to whether the third signal exceeds an average of at least the first and the second signals; and
a decoder circuit to decode a set of received data values, including at least the first, second and third received data values, to generate a smaller set of decoded data values.

20. The integrated circuit device of claim 19 wherein the set of decoded data values comprises one less data value than the set of received data values.

21. A signaling system comprising:
a transmit circuit to transmit a first signal and a plurality of second signals;
a first sampling circuit coupled to receive the first signal and the plurality of second signals from the transmit circuit and configured to generate a first received data value in one of at least two states according to whether the first signal exceeds an average of the second signals; and
a second sampling circuit coupled to receive the first signal and the plurality of second signals from the transmit circuit and configured to generate a second received data value in one of the at least two states according to whether a first one of the plurality of second signals exceeds an average of at least the first signal and a second one of the plurality of second signals.

22. The signaling system of claim 21 wherein the transmit circuit comprises:
an encoding circuit to encode a set of transmit data values to generate a larger set of encoded data values; and
a plurality of output drivers to receive the set of encoded data values from the encoding circuit and output a corresponding set of signals to the first sampling circuit, the set of signals including at least the first signal and the plurality of second signals.

23. The signaling system of claim 21 further comprising:
a third sampling circuit coupled to receive the first signal and the plurality of second signals from the transmit circuit and configured to generate a third received data value in one of the at least two states according to whether the second one of the plurality of second signals exceeds an average of at least the first signal and the first one of the plurality of second signals.

24. The signaling system of claim 21 further comprising a plurality of signal conductors to conduct the first signal and the plurality of second signals from the transmit circuit to the first sampling circuit.

25. A signaling system comprising:
a transmit circuit to transmit at least a first, a second, and a third signals;
a first sampling circuit coupled to receive at least the first, the second, and the third signals from the transmit circuit and configured to generate a first received data value in one of at least two states according to whether the first signal exceeds an average of at least the second and the third signals;
a second sampling circuit coupled to received at least the first, the second, and the third signals from the transmit circuit and configured to generate a second received data value in one of at least two states according to whether the second signal exceeds an average of at least the first and the third signals;
a third sampling circuit coupled to receive at least the first, the second, and the third signals from the transmit circuit and configured to generate a third received data value in one of the at least two states according to whether the third signal exceeds an average of at least the first and the second signals; and
a decoder circuit to decode a set of received data values, including at least the first, second and third received data values, to generate a smaller set of decoded data values.

26. The signaling system of claim 25 wherein the transmit circuit and the first sampling circuit are disposed in respective integrated circuit dice.

27. An apparatus comprising a computer-readable storage media, the computer-readable storage media comprising:
information that inclues a description of an integrated circuit device, the information including descriptions of:
an interface to receive a first signal and a plurality of second signals;
a first sampling circuit coupled to receive the first signal and the plurality of second signals from the interface and configured to generate a first received data value in one of at least two states according to whether the first signal exceeds an average of the second signals;
a second sampling circuit coupled to receive the first signal and the plurality of second signals from the transmit circuit and configured to generate a second received data value in one of the at least two states according to whether a first one of the plurality of second signals exceeds an average of at least the first signal and a second one of the plurality of second signals; and data adapted to cause the processor of a data processing device to operate upon the information.

28. An apparatus comprising:

means for receiving a first signal and a plurality of second signals;

means for generating a first received data value in one of at least two states according to whether the first signal exceeds an average of the second signals; and means for generating a second received data value in one of the at least two states according to whether a first one of the second signals exceeds an average of at least the first signal and a second one of the second signals.

* * * * *